(12) United States Patent
Jones et al.

(10) Patent No.: US 6,355,362 B1
(45) Date of Patent: *Mar. 12, 2002

(54) ELECTRONICS PACKAGES HAVING A COMPOSITE STRUCTURE AND METHODS FOR MANUFACTURING SUCH ELECTRONICS PACKAGES

(75) Inventors: Herman L. Jones, Wenatche; Edward A. Taylor, East Wenatchee, both of WA (US)

(73) Assignee: Pacific Aerospace & Electronics, Inc., Wenatchee, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/302,590

(22) Filed: Apr. 30, 1999

(51) Int. Cl.[7] .................... B32B 15/04; H01L 23/14; H05K 7/20
(52) U.S. Cl. .................. 428/614; 428/469; 428/472; 428/660; 428/663; 428/650; 361/707; 361/708; 361/710; 257/720
(58) Field of Search ................ 428/614, 660, 428/650, 652, 651, 654, 469, 472; 257/720, 675; 361/707, 704, 708, 709, 710

(56) References Cited

U.S. PATENT DOCUMENTS

| 3,399,332 A | * | 8/1968 | Savolainen | 428/614 |
|---|---|---|---|---|
| 5,002,115 A | | 3/1991 | Noordegraaf et al. | 164/97 |
| 5,025,347 A | * | 6/1991 | Shindo et al. | 361/386 |
| 5,025,849 A | | 6/1991 | Karmarker et al. | 164/97 |
| 5,039,577 A | * | 8/1991 | Knoell et al. | 428/614 |
| 5,040,588 A | | 8/1991 | Newkirk et al. | 164/97 |
| 5,132,776 A | * | 7/1992 | Hanada et al. | 357/81 |
| 5,163,499 A | | 11/1992 | Newkirk et al. | 164/98 |
| 5,223,278 A | | 6/1993 | Nicetto | 425/150 |
| 5,298,683 A | | 3/1994 | Taylor | 174/152 GM |
| 5,433,260 A | | 7/1995 | Taylor | 164/97 |
| 5,526,867 A | | 6/1996 | Keck et al. | 164/97 |
| 5,616,421 A | * | 4/1997 | Sawtell et al. | 428/614 |
| 5,675,122 A | | 10/1997 | Taylor | 174/50.58 |
| 5,704,212 A | | 1/1998 | Erler et al. | 62/3.2 |
| 5,746,267 A | | 5/1998 | Yun et al. | 164/65 |
| 5,775,403 A | | 7/1998 | Premkumar et al. | 164/98 |
| 5,865,912 A | | 2/1999 | Morimoto et al. | 148/440 |
| 5,878,322 A | | 3/1999 | Polese | 419/38 |
| 5,886,407 A | | 3/1999 | Polese et al. | 257/706 |
| 5,920,458 A | * | 7/1999 | Azar | 361/704 |
| 5,981,085 A | * | 11/1999 | Nimomiya et al. | 428/614 |
| 6,114,048 A | * | 9/2000 | Jech et al. | 428/620 |

FOREIGN PATENT DOCUMENTS

WO  9427765  12/1994  ............. B22F/3/00

OTHER PUBLICATIONS

Ahmed A. Abdel–Hamid, "Hot Dip Aluminide Coating of Ti and the Effect of Impurities and Alloyin gAdditions in the Molten A1 Bath", Bd., vol. 82, H. 12, pp. 921–927 (1991) (no month).

Abstract—"AISiC™ Performance Package," *PCC–Advanced Forming Technology*, Resource Library Web Site, pp. 1–9 (1998) (no month).

* cited by examiner

Primary Examiner—John J. Zimmerman
(74) Attorney, Agent, or Firm—Ann W. Speckman; Jim Klaniecki

(57) ABSTRACT

Electronics packages having a primary metallic material, such as a titanium metallic material, metallurgically bonded to one or more secondary regions within the primary metallic material, the composite regions having desirable thermal conductivity properties and having a coefficient of thermal expansion ("CTE") that generally matches the CTE of the primary metallic material are provided. Electronics packages comprising titanium having heat sinks comprising a metal matrix material such as aluminum silicon carbide or a composite metallic structure such as titanium aluminide/copper, are described. Methods for manufacturing electronics packages having a composite structure are also disclosed.

33 Claims, 4 Drawing Sheets

ELECTRONICS PACKAGES HAVING A COMPOSITE STRUCTURE AND METHODS FOR MANUFACTURING SUCH ELECTRONICS PACKAGES

FIELD OF THE INVENTION

The present invention relates to hermetic electronics packages constructed from a primary metallic material and having one or more secondary regions composed of material having disparate physical and/or structural properties. More specifically, electronics packages are provided with one or more regions of a secondary material having a high thermal conductivity and a coefficient of thermal expansion (CTE) that generally matches the CTE of the primary metallic material. In one embodiment, the electronics package comprises a primary metallic titanium component metallurgically bonded to a secondary metal matrix material, such as aluminum silicon carbide.

BACKGROUND OF THE INVENTION

Electronic components are used in countless applications in a wide variety of environments. Such components are subject to faulty operation, degradation and corrosion resulting from contact with dust, water vapor, gases, and the like, as well as from high IC) temperature and/or pressure conditions. Such components are, therefore, generally sealed in a hermetic electronics package to provide protection from the operating environment.

Electronics packages typically comprise a box-like structure, in the interior of which the electronic components are mounted. The package is generally provided with feedthrough holes through which conductive wires are sealed with an insulator such as glass or ceramic and are used to operatively connect electronic components inside the package to electronic and electrical sources and systems outside the package. The conductive wires are electrically insulated from and hermetically sealed into the package. After the electronic components are mounted in the package and operatively connected to the conductive wires, a cover is hermetically sealed to the package base to seal the interior of the electronics package.

Electronics packages are desirably constructed from materials that meet application specific requirements for density, thermal expansion, thermal conductivity, mechanical strength, and the like. For example, electronics packages used in aircraft and spacecraft applications must be lightweight and are therefore constructed from low density materials. Electronics packages that are used in high power applications should be constructed from materials having a high thermal conductivity, so that heat generated within the package is conducted outside the package to maintain lower operating temperature conditions inside the package. In other words, heat must be efficiently dissipated from inside the package. The service life of components is increased considerably when lower temperatures are maintained within the electronics package.

Electronics packages are desirably constructed from materials having a coefficient of thermal expansion (CTE) approximately equal to that of the materials the packages contact. That is, the thermal expansion properties of the electronics package must be compatible with the thermal expansion properties of the circuitry mounted in the package. Otherwise, temperature changes produce stress between the package and its electrical circuitry as they expand and contract at different rates. Additionally, because electronic components are often mounted on ceramic chips having a low CTE, most electronic packaging applications require package materials having a low CTE, generally matching or slightly higher than that of the ceramic chips. The ceramic chips comprise materials such as silicon, gallium-arsenide and alumina. These materials are fragile and susceptible to breakage if they are mounted to a package having an incompatible CTE. Therefore, it is important to mount these chips to a package with similar expansion rate characteristics.

Electronics packages constructed from ferrous alloys, such as Alloy 52 or KOVAR, have a desirably low CTE but are relatively heavy. Electronics packages constructed from aluminum are light in weight, but the CTE of aluminum is higher than desirable and is incompatible with the thermal expansion rates of conventional ceramic chips. Furthermore, many of these electronic chips generate significant heat when operating and it is important for these chips to be mounted to a material having high thermal conductivity characteristics that will dissipate the heat generated by the chips.

Thus, materials having a low density (for light weight applications), a CTE matching or slightly higher than the CTE of the electronic circuitry, high thermal conductivity for heat dissipation, good mechanical strength, and the ability to be hermetically sealed during final package assembly are desirable for electronics packaging applications.

Historically, hermetic electronic packages have been fabricated using a variety of techniques. One conventional approach involves machining or otherwise fabricating the entire package from an iron-based metal such as KOVAR, alloy 42 or a ferrous metal having similar properties. The feedthroughs and/or connectors are installed with standard glass-to-metal-seal technology, or are soldered, brazed or welded directly into the package. These packages have the advantage that the package and the electronic chips have compatible CTE's. They are disadvantageous, however, in that the package is heavy and has poor thermal conductivity. These types of packages are effectively limited to housing circuitry for non-power devices for applications other than aerospace.

Alternatively, the walls of the package may be manufactured from an iron-based alloy such as KOVAR, with the floor of the package composed of a composite metal or metal matrix material having a compatible CTE to that of the metallic package walls. The walls may be joined to the floor to form the electronics package using soldering or brazing techniques. Soldering requires plating of both the wall and floor sections. Welding techniques cannot be is used as a consequence of material incompatibility. Exemplary package floor materials include composite metals such as copper/molybdenum, copper/tungsten, and beryllium/aluminum, and metal matrix materials such as aluminum silicon-carbide, aluminum aluminum-oxide, copper graphite, and beryllium beryllium-oxide.

Another approach involves machining the entire electronics package from an aluminum alloy, such as alloy 6061. The feedthroughs and/or connectors are installed into the package by means of soldering or welding. An aluminum cover may be hermetically sealed to the package base using standard laser welding techniques. This package has the advantage of being lightweight and having a relatively high thermal conductivity, but the CTE of aluminum and aluminum alloys is generally incompatible with the CTE of the electronic chips. An alternative approach involves machining the entire electronics package base and/or connectors from a composite metal such as A40, an aluminum silicon composite, or ALBEMET™, a beryllium/aluminum metallic composite. The feedthroughs and/or connectors may be installed by means of specialized welding or plating soldering techniques.

Metal matrix composite materials, which incorporate a non-metallic reinforcing material dispersed within a metal matrix or host material, generally have desirable properties for electronics packaging applications, including a low density, low CTE, high thermal conductivity and good mechanical strength. These properties may be manipulated somewhat by selecting the metal matrix material and the form, proportion and composition of the reinforcing material. Metal matrix materials comprising aluminum or aluminum alloy matrices incorporating silicon carbide reinforcement material have low density, low CTE, good thermal conductivity, and suitable mechanical strength for use in electronics packaging applications.

Although metal matrix composite materials have desirable properties for use in electronics packaging applications, they have several practical disadvantages. Metal matrix materials cannot be machined using conventional tools and are provided in a three-dimensional configuration, such as an electronics package, using a casting process. The use of casting techniques limits the tolerances and versatility of electronics packages and increases the cost of producing the packages. Metal matrix materials generally cannot be laser welded as a consequence of differences in energy absorption rates between the metal matrix material and the non-metal reinforcing material. Feedthroughs and connectors may be sealed in metal matrix composite materials using soldering or welding techniques such as those described in U.S. Pat. No. 5,526,867.

One methodology for hermetically sealing a cover to an aluminum metal matrix electronics package is to fabricate a package base in which the upper sidewall rims are free of the reinforcing material, as described in "Investment Cast Metal Matrix Composite," by S. Kennerknecht, *Society of Manufacturing Engineers Technical Paper* EM90-411, 1990, available from the Society of Manufacturing Engineers in Dearborn, Mich. An aluminum/silicon carbide base may be cast using a preform, for example, forming an aluminum upper rim of the base sidewalls that is substantially free of the reinforcing material. A package cover, comprising aluminum or an aluminum alloy, may then be laser welded to the aluminum rim. Electronics packages having a metallic rim welded to an aluminum cover tend to warp, however, upon thermal cycling as a consequence of the difference between the CTE of the metal matrix composite package material and the CTE of the metallic rim and cover. This arrangement is generally useful only for very small electronics package applications in which warpage during operation is minor, but it is not suitable for larger electronics packages that are subjected to thermal cycling during operation.

Electronic packages may also be manufactured from metal matrix composite materials by means of infiltrating ceramic preforms with molten metal. This can be done by vacuum/pressure infiltration as described in U.S. Pat. No. 5,406,029, or by spontaneous infiltration as described in U.S. Pat. No. 5,526,867. The metal matrix composite package base is CTE compatible, has good thermal conductivity, and is lightweight. A three-dimensional metal matrix composite package base is not weldable, however, without the addition of metal inserts at the weld areas. Manufacturing techniques for producing metal matrix composite electronics bases generally are not cost competitive as a consequence of mold tooling and process complexity.

SUMMARY OF INVENTION

The present invention provides electronics packages constructed from a primary metal material metallurgically bonded to one or more secondary regions having desirable thermal conductivity properties and having a CTE that generally matches the CTE of the primary metallic package material. The secondary regions serve as heat sinks and provide for thermal dissipation from inside the electronics package or for thermal dissipation from a point source over a larger surface area. The primary metallic package material is preferably chemically reactive with a metallic constituent of the secondary region, providing a metallurgical bond between the primary metallic package material and the one or more secondary regions. The CTE match of the secondary region with the primary metallic package and metallurgical bond formed between the secondary region and the primary metallic package material provide an electronics package having reliable hermeticity and desirable mechanical strength properties.

One or more thermal coefficient of expansion property modifiers, such as one or more of the non-metallic or metallic reinforcing material(s), may be incorporated into the secondary material in a proportion sufficient to modify the CTE of the secondary region so that it is compatible with the CTE of the primary metallic package material. The metallic constituent of the secondary material preferably has a higher thermal conductivity than that of the primary metallic package material. Thus, the thermal conductivity of the secondary region is different from (generally higher than) the thermal conductivity of the primary metallic electronics package material, yet the CTE of the secondary region substantially matches the CTE of the primary metallic package material. According to preferred embodiments, the CTE of the secondary region also substantially matches or is slightly higher than the CTE of electronics components or substrates for such electronics components, such as ceramic chips, that are mountable in the interior of the electronics package.

According to one embodiment, the primary metallic electronics package material comprises titanium, or a titanium alloy, and the one or more secondary regions(s) comprises a metallic or metal matrix composite material having a high thermal conductivity, such as aluminum with tungsten or molybdenum, or aluminum silicon carbide (AlSiC). In this embodiment, the metallic aluminum component of the secondary material bonds metallurgically with the titanium component of the primary metallic package at the interface of the composite region(s) with the metallic package base. A desired proportion of a reinforcing material such as tungsten or molybdenum or silicon carbide material may be provided in the secondary material such that the secondary region has a CTE that substantially matches the CTE of the surrounding metallic electronics package material and is compatible with the CTE of ceramic circuitry. According to one embodiment, the CTE of the secondary region is slightly less than the CTE of the surrounding primary metallic electronics package material.

According to another embodiment, the primary metallic electronics package material comprises titanium or a titanium alloy, and one or more secondary regions comprises a secondary material having a high thermal conductivity, such as a composite metallic material. The term "composite" material, as used herein, refers to compositions composed of multiple base materials that are present in a variety of chemical and physical configurations. Composite materials thus comprehend both conventional "composite" materials, in which the constituents retain their individual chemical and structural integrity, and alloys, in which the constituents combine to form entities distinct from the individual constituents. Using this combination of primary and secondary materials, a metallurgical bond may be formed between the metallic package material and the secondary composite material. Additionally, the secondary metallic composite material has a high thermal conductivity compared to the thermal conductivity of the primary metallic material, yet the CTE of the secondary composite material substantially matches the CTE of the primary metallic package material.

The electronics package of the present invention has desirably lightweight and low density properties that are particularly suitable for aircraft and spacecraft applications. The primary metallic package may be economically and conveniently constructed using numerous conventional techniques, including machining, metal injection molding, casting, forging, or superplastic forming techniques. Using an electronics package material that is machinable is desirable because machining operations may achieve high tolerances and also provide versatility, since modifications to the three dimensional configuration of the electronics package base may be provided simply by modifying the machining process.

Feedthroughs, connectors, covers and other devices are preferably compatible with the primary metallic electronics package material and may be thus hermetically sealed to the metallic electronics package directly using conventional fusion welding techniques, such as laser or E-beam welding. If the electronics package base material comprises titanium, the feedthrough pins, connectors, accessories and package cover preferably comprise titanium or a material having thermal properties compatible with those of titanium. Alternatively, methods and systems for hermetically sealing metallic materials having incompatible thermal properties are described, for example, in U.S. Pat. Nos. 5,298,683, 5,433,260, 5,675,122, 5,110,307, 5,405,272, 5,041,019, 5,109,594 and 4,690,480. Any of these techniques may be used to hermetically seal feedthrough pins, connectors, accessories and package covers to a metallic electronics package base of the present invention.

BRIEF DESCRIPTION OF THE DRAWINGS

Preferred embodiments of the present invention will be described with reference to the figures, in which.

DESCRIPTION OF PREFERRED EMBODIMENTS

Figure 1:
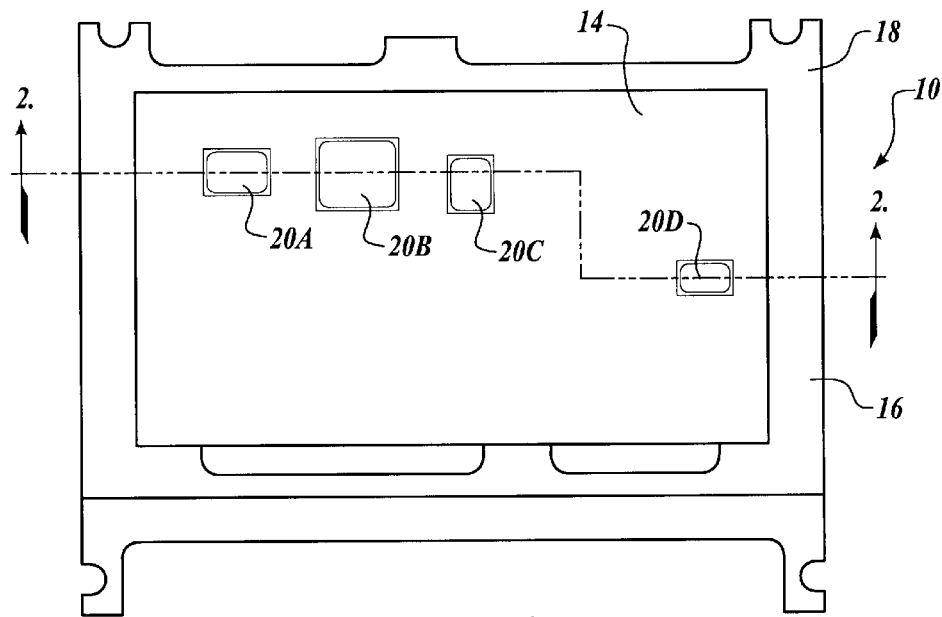
FIG. 1 illustrates a top view of an electronics package of the present invention having several recesses in the floor of the package for receiving secondary regions having high thermal conductivity and a CTE generally matching the CTE of the electronics package material.

Electronics packages of the present invention are composed of a primary metallic component and one or more regions of a secondary material having thermal conductivity properties that are different from the thermal conductivity properties of the electronics package. A metallic component of the primary electronics package material is metallurgically compatible with a metallic component of the secondary material, such that a metallurgical bond may be formed between the electronics package and the secondary region (s). The CTE of the secondary material generally matches the CTE of the primary metallic material of the package. The secondary region(s) are arranged to provide one or more heat sinks in the electronics package, providing for dissipation of heat from a heat source on an electronic device mounted within the electronics package. Secondary regions may alternatively or additionally may be arranged to provide one or more area(s) for mounting electronic components such as ceramic chips.

Suitable primary metallic base materials have low density for lightweight applications, good mechanical strength and hermeticity, and a CTE of about 13 ppm/° C. or less. Electronics packages comprising metallic titanium, beryllium, magnesium and composite metals such as A40, an aluminum silicon compatible metal; ALBEMET™, an aluminum beryllium composite metal; and ferrous metals, are suitable. Electronics packages comprising titanium are especially preferred. Commercially pure titanium materials are suitable, such as CP70, as are titanium alloys such as 6A14V, and other titanium alloys comprising at least about 60% titanium, more preferably at least about 80% titanium and most preferably at least about 90% titanium. Preferred metallic species in titanium alloys include aluminum, vanadium, and magnesium. The primary electronics package material most preferably has a CTE of from about 10 to 11 ppm/° C.

Electronic packages of the present invention may be constructed from a primary material having a uniform composition throughout its cross-section or, alternatively, may be constructed from a metallic material comprising, for example, two or more layers of materials having different properties. Explosion welded metallic materials are preferred, including materials comprising a ferrous material such as steel, stainless steel, iron-nickel alloys, and the like, explosion welded to a titanium containing metallic material. The titanium material may form the floor of the package base, while the ferrous material forms at least a part of the sidewalls of the package and facilitates hermetic sealing of connectors and a lid. Secondary regions may be provided as heat sinks in the titanium floor of the package, as described herein, while ferrous connectors and feedthroughs may be conveniently hermetically sealed in the sidewalls of the package using conventional fusion welding techniques such as laser welding.

Electronics packages comprising titanium may be economically produced in a variety of three-dimensional configurations using machining, metal injection molding, casting, forging, superplastic forming, stamping, drawing, coining, and powder metallurgy techniques. Electronics packages having conventional three-dimensional configurations with an interior space for mounting one or more electronics devices, feedthrough holes for receiving connectors or other feedthrough devices, and a generally open top for receiving a cover or lid, are suitable. Additionally, electronics packages of the present invention are provided with recesses in the floor and/or a sidewall region for receiving one or more secondary region(s) having thermal conductivity properties different from the thermal conductivity properties of the primary package material.

The secondary material has a relatively high thermal conductivity and a CTE that generally matches the CTE of the primary metallic base material. Many different types of secondary materials are suitable, including composite metal-containing and ceramic-containing materials. The secondary composite material preferably comprises one or more of the following materials: aluminum silicon carbide (AlSiC), aluminum aluminum oxide ($AlAl_2O_3$), aluminum graphite, beryllium beryllium oxide (BeBeO), aluminum boron oxide, magnesium aluminum oxide ($MgAl_2O_3$), titanium aluminide (all phases), titanium aluminide infiltrated with copper, aluminum, silver, nickel and other metals, titanium/copper intermetallics, titanium molybdenum, titanium tungsten and other titanium compounds, iron/nickel alloys, gold, silver, beryllium, aluminum beryllium metallic composites such as ALBEMET™, aluminum nitride, silicon carbide, aluminum oxide, boron oxide, magnesium oxide, tungsten carbide, beryllium oxide, copper molybdenum compounds, copper tungsten and composite metals such as A40, an aluminum silicon composite material, as well as composites of aluminum with tungsten and molybdenum.

According to one embodiment, the secondary material comprises: (1) a metallic constituent that is metallurgically compatible with a metallic component of the electronics package; and (2) a thermal property modifier, such as a reinforcing material, that is capable of modifying the CTE of the secondary material. Metal matrix composite materials including aluminum silicon carbide, beryllium beryllium oxide, aluminum aluminum oxide, aluminum boron oxide, aluminum graphite, magnesium aluminum oxide, and the like are suitable and are preferred. Aluminum silicon carbide is a preferred metal matrix composite material for use with metallic electronic packages comprising titanium. Composite metallic materials, including titanium or titanium aluminide infiltrated with another metallic species, composites of aluminum with silicon, tungsten, molybdenum, and the like, are preferred secondary materials for particular applications. Beryllium beryllium oxide is a preferred secondary composite material for use with metallic electronics packages comprising beryllium. The secondary material may be provided in one or more regions in the electronics package floor, sidewall(s) or cover.

Secondary materials comprising metallic composites, metallic alloys, and ceramic-containing materials may also be used in the high thermal conductivity region. Secondary metallic materials comprising titanium aluminide, titanium copper intermetallics, titanium molybdenum compounds, titanium tungsten compounds, and titanium aluminide infiltrated with copper, aluminum, silver, nickel and other metallic species are suitable. Other metallic composites such as ALBEMET™, an aluminum beryllium composite, aluminum nitride, copper molybdenum, copper tungsten and A40, an aluminum silicon composite, are also suitable.

A metallic constituent of the secondary material forming one or more high thermal conductivity region(s) is metallurgically compatible with, and therefore may be metallurgically bonded to, the primary metallic package material. Titanium and aluminum metallic components are exemplary, because they are metallurgically compatible and a metallurgical bond may be formed at an interface of a titanium electronics package recess with an aluminum-containing secondary material. Secondary materials comprising aluminum as a metallic component are especially preferred for use with electronics packages comprising titanium because the aluminum and titanium materials bond metallurgically to provide a high degree of hermeticity and mechanical integrity. Metallurgical bonds may also be formed between other combinations of active metals. Forming a metallurgical bond between the primary electronics package material and the secondary material furthermore provides manufacturing advantages, because it does not require welding, soldering, brazing or the like.

The secondary material preferably has a CTE matched within at least about 2 units (ppm/° C.) to the CTE of the primary material forming the electronics package. Thus, the desired CTE of an aluminum silicon carbide secondary material used in connection with a titanium electronics package having a CTE of about 10 to 10.5 ppm/° C. is preferably from about 8 to 12.5 ppm/° C. In this example, the CTE of the metallic constituents of the secondary material, aluminum, is considerably higher than the desired CTE for the secondary material, and silicon carbide reinforcing material is introduced and/or concentrated to provide a secondary metal matrix material having the desired CTE of from about 8 to 12.5 ppm/° C. Commercially available aluminum silicon carbide generally has a silicon carbide concentration of approximately 10% to 30%, by volume. This material has desirably high thermal conductivity properties, but it has an undesirably high CTE. Aluminum silicon carbide matrix materials in which the reinforcing silicon carbide material approaches a concentration of approximately 50% by volume has an appropriate CTE. Casting and other forming methods for achieving a desirably high load of reinforcing silicon carbide in the composite material are described below. Metallic materials, such as tungsten, molybdenum, and the like, may also be introduced to aluminum-containing secondary materials to provide the desired CTE properties.

In an especially preferred embodiment wherein the primary electronics package comprises a titanium material having a CTE of from about 10 to 10.5 ppm/° C., the high thermal conductivity secondary material preferably has a CTE of from about 9.5 to 10.5 ppm/° C., just slightly below the CTE of the electronics package. In this embodiment, the slight CTE difference provides a compressive bond between the secondary material and the electronics package that enhances the mechanical strength of the package.

Figure 2:
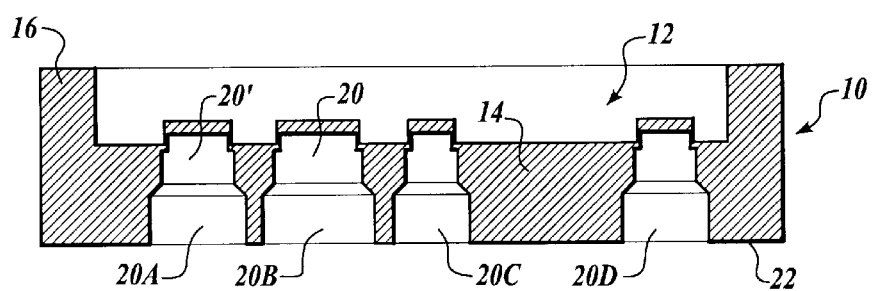
FIG. 2 illustrates a cross-sectional view of the electronics package of FIG. 1 taken along line 2—2 of FIG. 1.

FIG. 1 illustrates a top view and FIG. 2 illustrates a cross-sectional view of an electronics package of the present invention. Electronics package 10 forms an interior space 12 defined by package floor 14 and sidewalls 16. Lugs 18 or similar mounting devices are provided for mounting the electronics package to a desired installation location.

One or more recesses, illustrated in FIGS. 1 and 2 as recesses 20A, 20B, 20C and 20D are provided in the exterior surface 22 of package 10. Recesses 20A–D are provided for receiving a secondary material having thermal conductivity properties different from the thermal conductivity properties of the electronics package material. Recesses 20A–D may penetrate the floor 14 of package 10. Alternatively, as shown in FIG. 2, recesses 20A–D may terminate at caps 24A–D projecting from and forming part of interior floor 14 of the electronics package. Recesses 20A–D may be provided having various sizes and configurations and are preferably formed by machining from exterior surface 22 and/or interior floor 14 of package base 10. Recesses 20 receive a secondary material having high thermal conductivity properties for dissipating heat from a heat source on an electronic device mounted on the interior of the electronics package and are generally provided at locations in floor 14 of package 10 in proximity to mounting locations for electronic components that generate heat during operation.

The location and surface area size and configuration of recesses 20 and, thus, the location, surface area size and configuration of the secondary regions provided for dissipating heat from the heat source on an electronic device mounted on the interior of the package, may be modified depending on the thermal dissipation requirements of the package. Recesses 20 may be provided in a generally square, rectangular, polygonal, circular or oval configuration to provide secondary regions having a generally square, rectangular, polygonal, circular or oval surface area configuration. Recesses 20 may be chamfered, as shown in FIG. 2, to provide additional volume for receiving the secondary material.

Suitable secondary materials having thermal conductivity properties different from the thermal conductivity properties of the electronics package have been described and may be provided in recesses 20A–D using various techniques. Two manufacturing techniques are described herein in some detail, but it will be understood that various alternative techniques may be implemented as well. Preferred manufacturing techniques are described below with reference to an electronics package comprising titanium metal and a secondary region comprising aluminum silicon carbide. According to one preferred technique, the composite material is cast into a pre-formed metallic electronics package. According to another preferred embodiment, a pre-formed secondary material insert having the desired thermal conductivity and CTE properties is melted or squeeze cast into the electronics package recess(es). In general, the secondary region may be formed using a variety of techniques, including vacuum/pressure casting, die casting, gravity casting, squeeze casting or centrifugal casting techniques; forging techniques; superplastic forming techniques; metal injection molding techniques; and powder metallurgy techniques using sintering and/or infiltration methods.

More specifically, in a manufacturing technique in which the secondary region is cast into the electronics package, package 10 is thoroughly cleaned to remove any oxidation products or foreign materials using, for example, methyl ethyl ketone (MEK) and an acetone wash. A release agent such as boron nitride is applied to surfaces of the electronics package that are not desired to be metallurgically bonded to the secondary material. For most applications, the release agent is applied to the surface areas forming the interior space of the package, and to the exterior sidewalls of the package. This prevents formation of a metallurgical bond between the package and the secondary material on all surface areas except recesses 20A–D.

Desired interface surfaces of the electronics package with the secondary material, such as the interior surfaces of recesses 20A–D, are contacted with a metallurgically compatible material, such as an aluminum-containing material, under conditions that promote formation of a metallurgical bond between the metallic component of the electronics package, e.g., titanium, and a metallurgically compatible material, e.g., aluminum. A metallurgical bond is formed when two metallic components, such as titanium and aluminum, react chemically to form intermetallic bonds. In the embodiment described herein, aluminum from the secondary material reacts with the titanium metallic component of the electronics package to form an inter-metallic species, such as titanium aluminide, $TiAl_3$.

According to preferred embodiments, desired interface surfaces of a titanium electronics package are metallurgically bonded to aluminum, or to a secondary material comprising aluminum. In one embodiment, an aluminum coating is metallurgically bonded to desired interface surfaces of a titanium electronics package by contacting the desired interface surface(s) with molten aluminum. In this embodiment, a secondary material comprising an aluminum metallic component may subsequently be bonded to the aluminum coating and, hence, to the titanium electronics package.

Alternatively, a secondary material comprising an aluminum or aluminum alloy metallic component may be directly metallurgically bonded to desired interface surfaces of the electronics package. Aluminum silicon carbide comprising silicon carbide in a concentration of from about 10% to about 50% by volume, and more preferably about 20% by volume, may be provided in a molten form and agitated or otherwise maintained in a suspended and homogeneous condition. Aluminum silicon carbide may be maintained in a molten condition, for example, in an appropriate receptacle at a temperature of about 1350° F.

Desired interface surfaces of the titanium package are contacted to the metallurgically compatible molten metallic or secondary material using any appropriate technique, such as dipping in the molten aluminum or aluminum silicon carbide material, under conditions that substantially prevent the formation of oxides at the interface of the package and the molten secondary material. The molten aluminum silicon carbide may be maintained, for example, in an enclosed space under an argon cover gas to prevent or retard the formation of oxides at the metallurgical bond interface. The electronics package may be dipped and maintained in contact with the molten aluminum-containing material for a reaction period sufficient to establish a metallurgical bond between the aluminum and titanium metallic materials in exposed areas of the package that are free of the release agent. A retention time of five minutes is generally sufficient to provide a metallurgical bond between titanium and molten aluminum. Alternative materials and aluminum composites may require alternative temperatures and retention times. Alternatively, a metallurgical bond between two metallic materials, such as titanium and aluminum, may be provided using an inert gas furnace.

Following the formation of a metallurgical bond at desired interface surfaces of the electronics package, recesses 20A–D are packed with a secondary material. This may be accomplished in a single process step when the electronics package is dipped or submerged in molten secondary material, such as aluminum silicon carbide. In this embodiment, the package is removed from the molten secondary material so that molten secondary material fills recesses 20A–D. The assembly, comprising the package base having recesses 20A–D filled with molten aluminum silicon carbide secondary material, may be permitted to cool.

The cooled assembly, or the assembly with the secondary material in a molten or partially molten form, is preferably treated to concentrate the silicon carbide material, forming an aluminum silicon carbide secondary material in the interior volume of recesses 20A–D having the desired CTE properties. As described above, conventional aluminum silicon carbide materials having a concentration of silicon carbide reinforcing material of about 20% by volume, have an undesirably high CTE. Silicon carbide reinforcing materials are therefore concentrated according to methods of the present invention to provide secondary regions having a silicon carbide concentration of from about 30% to about 60% by volume, and more preferably from about 45% to about 55% by volume, and having a CTE of from about 8 to about 12.5 ppm/° C., more preferably of from about 9 to 11 ppm/° C.

The silicon carbide reinforcing material may be provided in the form of particles having a generally uniform particle size. Alternatively, distributions of various silicon carbide particle sizes may be preferred to obtain the desired packing density. Silicon carbide particle sizes of from about 5 microns to about 250 microns are suitable, with particle sizes of from about 5 microns to 150 microns being especially preferred. A multimodal distribution of particle sizes provides the desired packing density in the most efficient manner.

According to preferred embodiments, the assembly is treated in a heated centrifuge to provide the desired packing density of silicon carbide constituents in the secondary material loaded in recesses 20A–D. During centrifugation, silicon carbide particles migrate through the molten aluminum base matrix material in the direction of arrow B toward interior space 12 of electronics package 10. Centrifugation is carried out under conditions that promote migration of silicon carbide particles through the molten secondary matrix filling recesses 20A–D to provide a concentration of silicon carbide constituents of from about 25% to about 60% by volume, and preferably of from about 35% to 55% by volume in areas 20' of recesses 20A–D. Areas 20" of recesses 20A–D have a considerably lower loading of silicon carbide particles following centrifugation. According to preferred embodiments, areas 20" of recesses 20A–D principally comprise the aluminum matrix material.

The assemblies are preferably maintained at a temperature sufficient to maintain the metallic constituent of the secondary material in a molten form during centrifugation. Temperatures of about 1350° F. are suitable to maintain the aluminum metallic constituent of aluminum silicon carbide secondary materials in a molten form. Temperatures of less than 1375° F. are preferred to prevent the formation of aluminum carbide. The addition of silicon to the aluminum alloy also helps to prevent the formation of aluminum carbide. Centrifugation at gravitational forces of from about 200 g to about 1200 g are suitable, with forces of about 200 g to 400 g being especially preferred. Suitable centrifugation conditions and times may be ascertained by means of routine experimentation depending on the materials being used and the desired CTE properties of the composite matrix material. It is noted also that different casting techniques may be adapted for use with alternative materials. For some suitable secondary materials, including composite materials comprising aluminum as the metallic constituent of the secondary material, the reinforcing particles may be lighter than the primary metal, and centrifugation will have the effect of concentrating the metallic species rather than the particulate or secondary reinforcing species. Suitable casting techniques may be developed and implemented using routine experimentation.

Following concentration of the silicon carbide in the desired area 20' of the package recesses 20A–D, the assemblies are thoroughly cooled. Material comprising a portion of the electronics package, as well as secondary material in areas 20" of recesses 20A–D, is then removed from the package, for example, by machining along dashed line 26. If the secondary material in areas of recesses 20A–D in proximity to dashed line 26 comprises silicon carbide material, diamond cutters may be required to remove the material. Caps 24 forming a part of the electronics package may also be removed from the interior space 12 or electronics package 10 following processing, by machining or other techniques, to expose the concentrated metal matrix composite material metallurgically bonded to the electronics package in recesses 20A–D.

According to an alternative manufacturing technique, electronics package 10 having recesses 20A–D with their interior surfaces coated with and metallurgically bonded to an aluminum coating, may be filled with a pre-fabricated pellet comprising the desired secondary material and subsequently heated, for example, in a belt furnace, to melt the secondary material and metallurgically bond it to the aluminum coating and, hence, the electronics package. Secondary materials having the desired concentration of silicon carbide particles in an aluminum host matrix material may, for example, be provided in a pellet form. Squeeze casting techniques may also be employed to bond the secondary material in a recess in the electronics package.

Alternative manufacturing techniques may involve the use of powdered metal technology. In one embodiment, a prefabricated insert comprising powdered aluminum and silicon carbide in the form of a pellet may be placed in a recess of the electronics package having an aluminum coating and metallurgically bonded to the aluminum coating using a vacuum melt process. A similar technique may be used to bond metallic powder comprising titanium aluminide in a recess in the electronics package. The titanium aluminide secondary region may additionally be impregnated or infiltrated with another metallic material, such as copper, silver, gold, or the like, to achieve the desired CTE. When a prefabricated insert of secondary material is used, it may be inserted in the desired electronics package recess and infiltrated with a metallic material that forms a metallurgical bond with the primary electronics package material, or with a coating applied to the primary package material in the area of the recess.

According to yet another embodiment, a secondary material comprising a powdered metal or ceramic material may be packed into a pre-established cavity in the electronics package. The secondary material may comprise a powder or particulate form of one or more of the following materials: titanium, molybdenum, tungsten, aluminum, copper, gold, silver, beryllium, iron/nickel alloys, other iron-containing alloys, aluminum oxide, boron oxide, aluminum nitride, silicon carbide, tungsten carbide, and mixtures thereof. Titanium aluminide is a preferred secondary material for use in a powdered or particulate (or bead) form. Such secondary materials, and combinations of such materials, may be packed into one or more cavities of an electronics package preform. The secondary powdered metal and/or ceramic material may then be sintered to bond the powdered material together and to provide a metallurgical bond between the secondary material and the primary electronics package material. Following sintering, another material, such as metallic material, may be infiltrated into a porous, sintered secondary material. In an exemplary embodiment, copper is infiltrated into a sintered titanium-containing secondary region, preferably a titanium-aluminide secondary region.

Fabrication methods involving the use of secondary materials in a pellet or powdered or particulate form are as follows: a block of the primary electronics package material having dimensions corresponding to the outer dimensions of the finished electronics package, is provided. Recesses having the dimensions and configurations of desired secondary regions are then provided, for example, by machining in one surface of the block of primary electronics package material. The desired secondary material is then provided and bonded in the recesses. The interior space of the electronics package is then formed, for example, by machining the opposite face of the block of primary electronics package material. The secondary region(s) may be "intrusive," meaning that the secondary regions are exposed to both the interior and exterior surfaces of the electronics package, as illustrated in FIGS. 6A, 6B, 8A and 8B. Alternatively, the secondary regions may be "nonintrusive," meaning that the secondary regions are exposed only on the exterior surface of the electronics package. The nature of the secondary regions may be altered, for example, by altering the depth and dimensions of the recesses in the primary electronics package material, or by altering the machining process during formation of the electronics package. These techniques are also suitable for fabricating double-sided electronics packages having secondary regions providing heat sinks in the common package floor.

According to yet another embodiment of electronics packages of the present invention, a ceramic, electrically insulating material may be provided as a layer between the primary metallic electronics package material and the secondary material. In this embodiment, a wafer or thin film of ceramic material is placed in the recess provided in the primary metallic electronics package material prior to introducing and bonding the secondary material into the recess. During bonding of the secondary composite material to the recess in the primary metallic electronics package material, the ceramic insulator material is bonded in place. During forming of the interior space of the electronics package, for example, by machining the block of primary metallic electronics package material, the ceramic insulator may be exposed on the floor of the electronics package. This embodiment provides one or more electrically insulated surfaces for mounting electronic chips or other devices.

Figure 3:
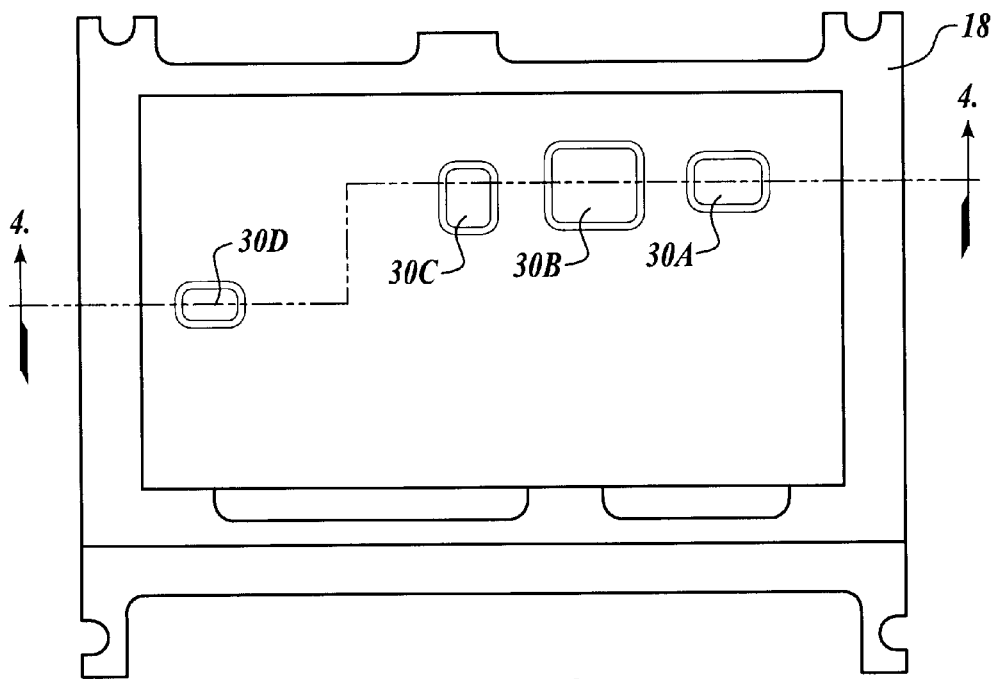
FIG. 3 illustrates a top view of an electronics package of the present invention having several secondary regions in the floor of the package.
Figure 4:
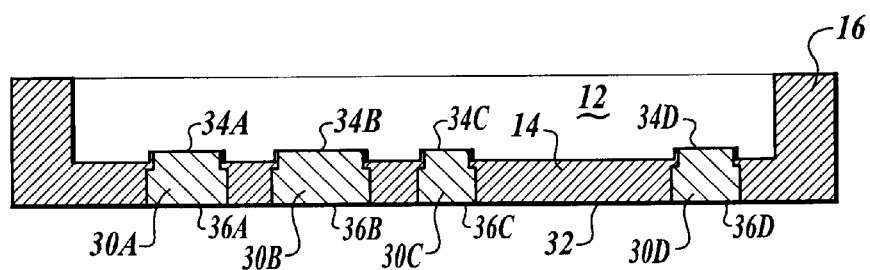
FIG. 4 illustrates a cross-sectional view of the electronics package of FIG. 3 taken along line 4—4 of FIG. 3.

FIGS. 3 and 4 illustrate an electronics package 10 having a plurality of secondary regions 30A–D, the secondary regions having a high thermal conductivity and a CTE that generally matches the CTE of the primary material forming electronics package 10. As described above, secondary regions 30A–D preferably have a high thermal conductivity and serve as heat sinks to dissipate heat from the electronic device mounted onto the interior of electronics package 10. Additionally, secondary regions 30A–D preferably have a CTE that generally matches or is slightly lower than the CTE of the primary material comprising the electronics package. Secondary regions having a CTE of from about 8 to about 12.5 ppm/° C. are preferred, with secondary regions having a CTE of from about 9 to 11 ppm/° C. being especially preferred.

Secondary regions 30A–D penetrate the floor of the electronics package and have interior exposed surfaces 34A–D facing the interior space 12 of package 10 and exterior exposed surfaces 36A–D aligned with exterior surface 32 of package base 10. Interior exposed surfaces 34A–D may protrude somewhat from floor 14 of electronics package 10 to provide a mounting area for an electronic component or may, alternatively, be flush with or recessed from floor 14. Although secondary regions 30A–D are illustrated as penetrating floor 14 of package base 10 and having exposed interior and exterior surfaces, it will be recognized that secondary regions that partially penetrate floor 14 of electronics package 10 and have only one exposed surface, either an exterior or an interior exposed surface, may also be suitable for certain applications. Multiple secondary regions in an electronics package may comprise the same material, or secondary regions having different compositions and, hence, different thermal conductivity and/or CTE properties, may be provided in an electronics package. Similarly, although the secondary regions are illustrated penetrating the floor of the electronics package, it will be appreciated that secondary regions having desirable thermal conductivity properties may be provided in a sidewall or even a cover of an electronics package using techniques similar to those described herein.

Figure 5:
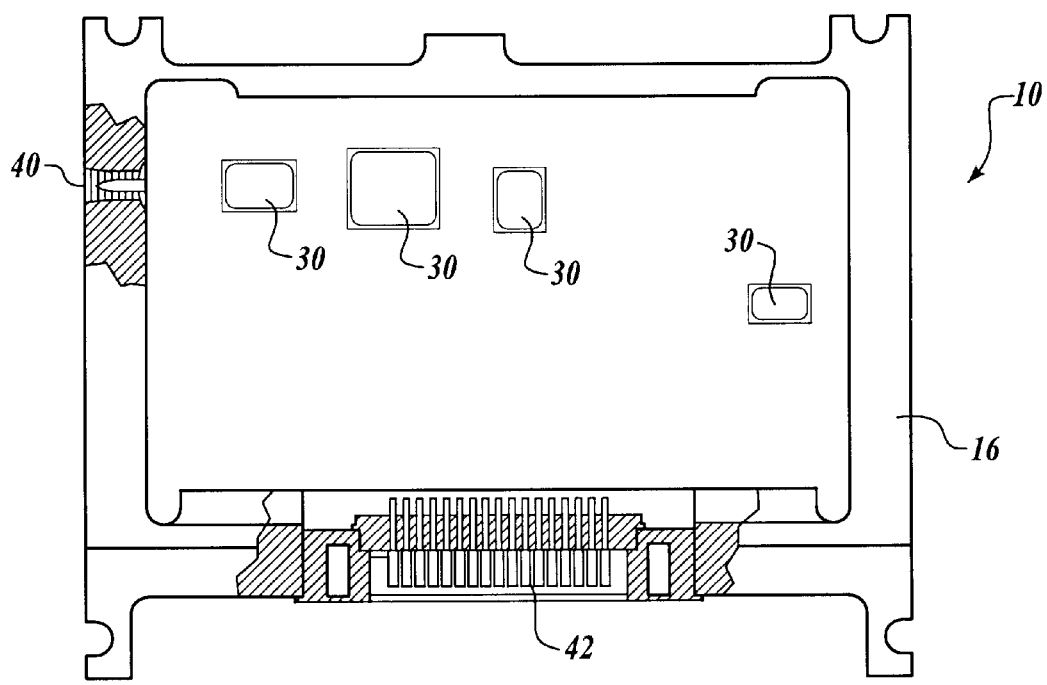
FIG. 5 illustrates an electronics package of the present invention including several secondary heat sink regions installed in the floor of the package and having a feedthrough and a connector mounted in sidewalls of the electronics package.

FIG. 5 illustrates an electronics package 10 of the present invention having a plurality of secondary regions 30 and having a connector 40 and a feedthrough device 42 mounted in sidewalls 16 of package 10. According to a preferred embodiment in which the electronics package comprises titanium, connector 40 and feedthrough device 42 are preferably constructed having titanium shells so that they may be fusion welded in appropriate bores through sidewalls 16 of electronics package 10. Connectors and hermetic sealing techniques described, for example, in U.S. Pat. No. 5,298,683, which is incorporated by reference herein in its entirety, are suitable.

Figure 6A:
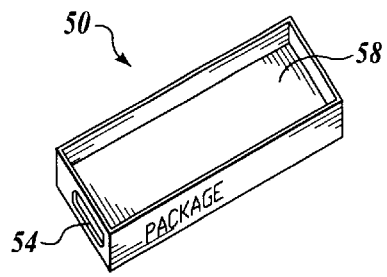
FIG. 6A illustrates a top perspective view and FIG. 6B illustrates a bottom perspective view of an electronics package having non-intrusive heat sinks.
Figure 7A:
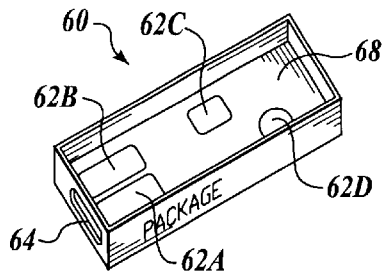
FIG. 7A illustrates a top perspective view and FIG. 7B illustrates a bottom perspective view of an electronics package having intrusive heat sinks.
Figure 6B:
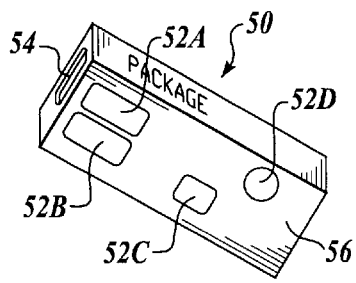
Figure 7B:
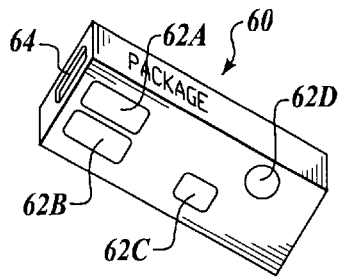

FIGS. 6A and 6B illustrate schematic top and bottom perspective views of electronics package 50 having secondary regions 52A, 52B, 52C and 52D in the floor of, and composite region 54 in the sidewall of, package 50. Composite regions 52A–D and 54 are referred to as "nonintrusive" because they penetrate exterior surface 56 of package 50, but they are not exposed on interior floor 58 of package 50. FIGS. 7A and 7B illustrate schematic top and bottom perspective views of electronics package 60 in which secondary regions 62A, 62B, 62C, 62D, and 64 are exposed on both exterior surface 1ab and interior floor 68 of package 60. These secondary regions are referred to as "intrusive."

Figure 8A:
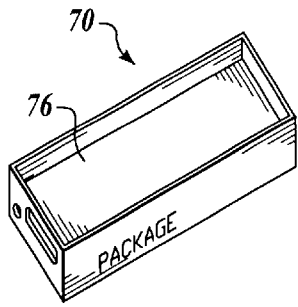
FIG. 8A illustrates a top perspective view and FIG. 8B illustrates a bottom perspective view of a double-sided electronics package having non-intrusive heat sinks.
Figure 9A:
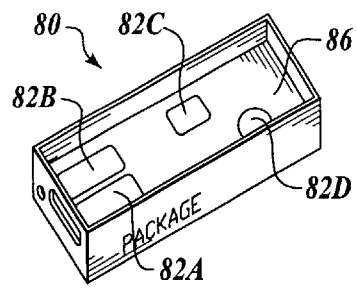
FIG. 9A illustrates a top perspective view and FIG. 9B illustrates a bottom perspective view of a double-sided electronics package having intrusive heat sinks.
Figure 8B:
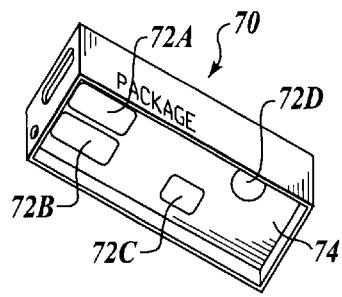
Figure 9B:
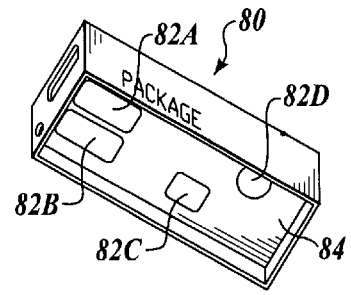

FIGS. 8A, 8B, 9A and 9B illustrate schematic top and bottom perspective views of "double-sided" electronics package 70 in which the floor of package 70 is in an intermediate location. Electronic components may be mounted to both surfaces and lids attached to form two separated packages having a common floor. FIGS. 8A and 8B illustrate electronics package 70 having secondary regions 72A, 72B, 72C, and 72D exposed on floor 74 of a first interior space, but not exposed on floor 76 of a second interior space. Floors 74 and 76 are formed by opposite faces of a central wall. FIGS. 9A and 9B illustrate electronics package 80 having secondary regions 82A, 82B, 82C, and 82D exposed both on floor 84 of a first interior space, and on floor 86 of a second interior space.

While the present invention has been described with reference to certain preferred embodiments, and certain preferred manufacturing techniques have been described, it will be understood that alternative embodiments and manufacturing techniques may be developed and adapted without departing from the principles of the invention.

We claim:

1. An electronics package comprising a primary metallic electronics package material having one or more recesses, wherein the primary metallic electronic package material has a first thermal conductivity and a first coefficient of thermal expansion; at least one secondary region disposed within the one or more recesses, wherein the at least one secondary region has a second thermal conductivity higher than the first thermal conductivity and a second coefficient of thermal expansion that substantially matches the first coefficient of thermal expansion.

2. An electronics package of claim 1, in which the primary metallic electronics package material comprises at least one material selected from the group consisting of titanium, beryllium, magnesium, aluminum composite metallic materials, aluminum beryllium, and ferrous metallic materials.

3. An electronics package of claim 1, in which the at least one secondary region comprises a metallic constituent that is metallurgically reactive with the primary metallic electronics package material.

4. An electronics package of claim 3, in which the at least one secondary region comprises aluminum.

5. An electronics package of claim 1, in which the secondary region comprises a metallic component and a reinforcing material.

6. An electronics package of claim 1, in which the at least one secondary region comprises at least one material selected from the group consisting of: aluminum, silicon carbide, aluminum silicon carbide, beryllium, beryllium oxide, aluminum oxide, magnesium oxide, boron oxide, aluminum aluminum oxide, aluminum boron oxide, magnesium aluminum oxide, titanium, titanium aluminide, a titanium copper intermetallic compound, titanium molybdenum, titanium tungsten, aluminum metallic composite materials, aluminum nitride, beryllium oxide, copper molybdenum, copper tungsten, tungsten, tungsten carbide, molybdenum, copper, gold, silver, and ferrous metallic materials.

7. An electronics package of claim 1, in which the at least one secondary region comprises an aluminum silicon carbide material.

8. An electronics package of claim 7, in which the aluminum silicon carbide material has a silicon carbide concentration of at least 25% by volume.

9. An electronics package of claim 7, in which the aluminum silicon carbide material includes silicon carbide particles having a multimodal distribution of particle sizes.

10. An electronics package of claim 1, in which the primary metallic electronics package material has a CTE of 13 ppm/° C. or less.

11. An electronics package of claim 1, in which the at least one secondary region has a CTE of less than 12.5 ppm/° C.

12. An electronics package of claim 1, in which the at least one secondary region has a CTE of greater than 8 ppm/° C.

13. An electronics package of claim 1, in which the second CTE is matched to within 2 units (ppm/° C.) to the first CTE.

14. An electronics package of claim 1, in which the primary metallic electronics package material has a composite metallic structure.

15. An electronics package of claim 14, in which the primary metallic electronics package material comprises an explosion welded composite metallic material.

16. An electronics package comprising a titanium-containing primary metallic electronics package structure having one or more recesses in which the primary metallic structure is metallurgically bonded to an aluminum-containing secondary material, wherein the aluminum-containing secondary material has a higher thermal conductivity than the titanium-containing primary metallic electronics package structure, and the aluminum-containing secondary material has a CTE that is matched to within 2 units (ppm/° C.) of the CTE of the titanium-containing primary metallic electronics package structure.

17. An electronics package comprising a primary metallic electronics package structure having a CTE of 13 ppm/° C. or less having one or more recesses in which the primary metallic structure is metallurgically bonded to a secondary material, wherein the secondary material has a higher thermal conductivity than the primary metallic electronics package structure, and the secondary material has a CTE of between 8 and 12.5 ppm/° C.

18. An electronics package of claim 17, additionally comprising an electrical insulator material bonded to the secondary material.

19. An electronics package component comprising a titanium-containing electronics package structure having a three dimensional configuration with an interior space for mounting one or more electronics devices, one or more feedthrough holes for receiving connectors or other feedthrough devices, and a generally open top for receiving a cover, wherein at least one of the floor and a sidewall is provided with a recess for receiving a secondary region having a thermal conductivity higher than the thermal conductivity of the primary electronics package structure.

20. An electronics package comprising a primary metallic electronics package material having a first thermal conductivity and a first CTE and having at least one recess that is bonded to at least one secondary region having a second thermal conductivity higher than the first thermal conductivity and a second CTE that substantially matches the first CTE, and additionally having a connector and a feedthrough device mounted in a sidewall of the electronics package.

21. An electronics package of claim 20, in which the primary metallic package material comprises titanium.

22. An electronics package of claim 21, in which the connector and the feedthrough device have shells comprising titanium and are fusion welded to the electronics package component.

23. An electronics package of claim 20, additionally comprising a cover sealed to the electronics package to provide a hermetically sealed electronics package.

24. An electronics package of claim 20, in which the electronics package comprises at least two layers of metallic materials having different properties.

25. An electronics package of claim 20, additionally comprising an electrical insulator material bonded to the secondary material.

26. An electronics package of any of claims 1, 2, 19 or 20, wherein the secondary region comprises copper molybdenum.

27. An electronics package of claims 1 or 20, wherein the primary metallic electronics package material consists of titanium or a titanium alloy.

28. An electronics package of any of claims 16, 17 or 19 wherein the primary metallic electronics package structure consists of titanium or a titanium alloy.

29. An electronics package of any of claims 1 or 19 or 20, wherein the one or more secondary region(s) has a generally square, rectangular, polygonal, circular or oval configuration.

30. An electronics package of claims 1 or 20, wherein the secondary region is intrusive.

31. An electronics package of claims 1 or 20, wherein the secondary region is non-intrusive.

32. An electronics package of claims 1 or 20, wherein the secondary region has surfaces that are flush with the surfaces of the primary metallic base material.

33. An electronics package of claims 1 or 20, wherein the secondary material has at least one surface that is raised relative to a surface of the primary metallic base material.

* * * * *